(12) United States Patent
Ko et al.

(10) Patent No.: US 7,709,845 B2
(45) Date of Patent: May 4, 2010

(54) SEMICONDUCTOR LIGHT EMITTING DEVICE WITH IMPROVED CURRENT SPREADING STRUCTURE

(75) Inventors: Kun Yoo Ko, Kyungki-do (KR); Young Ho Park, Kyungki-do (KR); Bok Ki Min, Kyungki-do (KR); Hyung Jin Park, Kyungki-do (KR); Seok Min Hwang, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 152 days.

(21) Appl. No.: 11/588,330

(22) Filed: Oct. 27, 2006

(65) Prior Publication Data

US 2007/0102715 A1 May 10, 2007

(30) Foreign Application Priority Data

Nov. 7, 2005 (KR) ............... 10-2005-0106155

(51) Int. Cl.
*H01L 27/15* (2006.01)

(52) U.S. Cl. ............... 257/79; 257/13; 257/81; 257/88; 257/98; 257/99; 257/103; 257/E33.047; 257/E33.067; 257/E33.069

(58) Field of Classification Search ............ 257/13, 257/79, 81, 88, 98, 99, 103, E33.047, E33.067, 257/E33.069
See application file for complete search history.

(56) References Cited

U.S. PATENT DOCUMENTS 6,107,644 A * 8/2000 Shakuda et al. ............ 257/79

| | | | |
|---|---|---|---|
| 6,618,418 B2 * | 9/2003 | Northrup et al. | 372/46.01 |
| 7,358,544 B2 * | 4/2008 | Sakamoto et al. | 257/103 |
| 2005/0148194 A1 * | 7/2005 | Lan et al. | 438/706 |
| 2006/0244005 A1 * | 11/2006 | Chen | 257/122 |

FOREIGN PATENT DOCUMENTS

| | | |
|---|---|---|
| JP | 08-023124 | 1/1996 |
| JP | 10-229219 | 8/1998 |
| JP | 11-186600 | 7/1999 |
| JP | 2003-110139 | 4/2003 |
| JP | 2005197573 A * | 7/2005 |

OTHER PUBLICATIONS

Japanese Office Action issued in Japanese Patent Application No. JP 2006-288450 dated Jan. 19, 2010.

* cited by examiner

*Primary Examiner*—Andy Huynh
(74) *Attorney, Agent, or Firm*—McDermott Will & Emery LLP

(57) ABSTRACT

The invention relates to a high-quality semiconductor light emitting device which suppresses current concentration. The semiconductor light emitting device includes an n-type semiconductor layer, an active layer and a p-type semiconductor layer sequentially formed on a substrate. The semiconductor light emitting device further includes a p-electrode formed on the p-type semiconductor layer and an n-electrode formed on a surface of a mesa-etched portion of the n-type semiconductor layer. A trench is formed in the n-type semiconductor layer to prevent current concentration. The trench is extended from an upper surface of the mesa-etched portion of the n-type semiconductor layer or from a bottom surface of the substrate into the n-type semiconductor layer at a predetermined depth.

11 Claims, 3 Drawing Sheets

SEMICONDUCTOR LIGHT EMITTING DEVICE WITH IMPROVED CURRENT SPREADING STRUCTURE

CLAIM OF PRIORITY

This application claims the benefit of Korean Patent Application No. 2005-106155 filed on Nov. 7, 2005, in the Korean Intellectual Property Office, the disclosure of which is incorporated herein by reference.

BACKGROUND OF THE INVENTION

1. Field of the Invention

The present invention relates to a semiconductor light emitting device, and more particularly, to a semiconductor light emitting device having superior current spreading and operation voltage characteristics, and improved reliability.

2. Description of the Related Art

Recently, light emitting devices such as light emitting diodes (LEDs) using group III-V nitride semiconductors (simply, nitride semiconductors) are widely adopted as light sources to obtain blue or green wavelength ranges of light. The nitride semiconductor is a compound semiconductor having a composition expressed by a formula, $In_xAl_yGa_{(1-x-y)}N$, where $0 \leq x \leq 1$, $0 \leq y \leq 1$ and $0 \leq x+y \leq 1$. The nitride semiconductor light emitting device typically includes n-type and p-type nitride semiconductor layers grown on a sapphire substrate. Since the sapphire substrate is an insulator, the p- and n-electrodes are disposed on the same side of the substrate (lateral structure). In such a lateral structure of nitride semiconductor light emitting device, there is a problem of current being concentrated at a specific area of the n-type nitride semiconductor layer which is a boundary between a mesa-etched portion and a remaining portion, adjacent to the n-electrode.

FIG. 1 is a sectional view illustrating a conventional nitride semiconductor light emitting device. Referring to FIG. 1, the light emitting device 50 includes an n-type GaN-based semiconductor layer 13, an active layer 15 and a p-type GaN-based semiconductor layer 17 sequentially formed on a sapphire substrate 11. A p-electrode (p-metal) 20 is disposed on the p-type GaN-based semiconductor layer 17, and an n-electrode (n-metal) 30 is disposed on a portion of an upper surface of the n-type GaN-based semiconductor layer 13 exposed by mesa-etching. To form such a mesa structure, mesa etching is conducted in thousands of Å of depth M until the n-type semiconductor layer 13 is exposed.

When operating voltage is applied to the p- and n-electrodes 20 and 30 disposed laterally from each other, current flows through a p-n junction of GaN-based semiconductor and thereby light emission takes place in the active layer. Supposing that the path of the current running on the light emitting device 50 is divided into A, B and C as shown in FIG. 1, relatively greater current flows through and concentrated in path A. The reason for this is that path A has smaller resistance than path B or path C. That is, in path A, the distance of the current passing through the p-electrode of smaller resistance is relatively long whereas the distance of the current passing through the nitride semiconductor layer of greater resistance is relatively short. Resultantly, the current tends to be concentrated in path A of smaller resistance.

As described above, if the current is concentrated in a particular path (path A in which the current passes through the nitride semiconductor layer in the shortest distance), the active layer is not entirely and uniformly utilized. This results in an increase in the operation voltage and a decrease in the luminance. In addition, if the current is concentrated in a particular portion, much heat is generated at that particular portion and the Electrostatic Discharge (ESD) characteristics of the device are degraded. This consequently degrades the reliability of the device. Having the lateral structure in which the two electrodes are disposed on the same side of the substrate, light emitting devices made of not only the nitride semiconductor (GaN-based) but also other types of compound semiconductor (e.g., AlGaAs-based or AlGaInP-based semiconductors) can be adversely affected by such current concentration.

SUMMARY OF THE INVENTION

The present invention has been made to solve the foregoing problems of the prior art and therefore an object of certain embodiments of the present invention is to provide a semiconductor light emitting device which suppresses current concentration in a particular path or portion thereof, thereby achieving superior current spreading characteristics.

According to an aspect of the invention for realizing the object, there is provided a semiconductor light emitting device including: an n-type semiconductor layer, an active layer and a p-type semiconductor layer sequentially formed on a substrate; a p-electrode formed on the p-type semiconductor layer; and an n-electrode formed on an upper surface of a mesa-etched portion of the n-type semiconductor layer, wherein the n-type semiconductor layer has a trench formed therein to prevent current concentration, and the trench is extended from an upper surface of the n-type semiconductor layer or from a bottom surface of the substrate into the n-type semiconductor layer at a predetermined depth.

Preferably, the trench is extended into the n-type semiconductor layer at a depth that is ½ or less of the thickness of the mesa-etched portion of the n-type semiconductor layer. More preferably, the trench is extended into the n-type semiconductor layer at a depth that is ⅙ to ½ of the thickness of the mesa-etched portion of the n-type semiconductor layer.

According to the present invention, the trench may be filled with an insulating material. For example, the trench may be filled with an insulation resin or oxidation film.

According to an embodiment of the invention, the trench is located between the p-electrode and the n-electrode, and may be extended downward from an upper surface of the mesa-etched portion of the n-type semiconductor layer. In this case, preferably, the trench has a depth that is ½ or less of the thickness of the mesa-etched portion of the n-type semiconductor layer, and more preferably, ⅙ to ½ of the thickness of the mesa-etched portion of the n-type semiconductor layer.

According to another embodiment of the present invention, the trench may be extended upward from a bottom surface of the substrate. In this case, the trench may be extended to the mesa-etched portion of the n-type semiconductor layer. Alternatively, the trench may be extended to the portion of the n-type semiconductor layer that is not mesa-etched. In this case, the difference between the depth of the trench and the thickness of the substrate is ½ or less of the thickness of the mesa-etched portion of the n-type semiconductor layer, and more preferably, ⅙ to ½ of the thickness of the mesa-etched portion of the n-type semiconductor layer.

According to a preferred embodiment of the invention, the n-type semiconductor layer, the active layer and the p-type semiconductor layer are made of nitride semiconductor. In this case, the p-electrode may be a transparent electrode or reflective electrode. In addition, the substrate may be a sapphire substrate.

According to the present invention, the trench is configured to be extended into the n-type semiconductor layer at a predetermined depth, thereby preventing current concentration and more uniformly spreading the current. This consequently improves light emission efficiency, luminance and operating voltage characteristics and reliability of the device.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Figure 1:
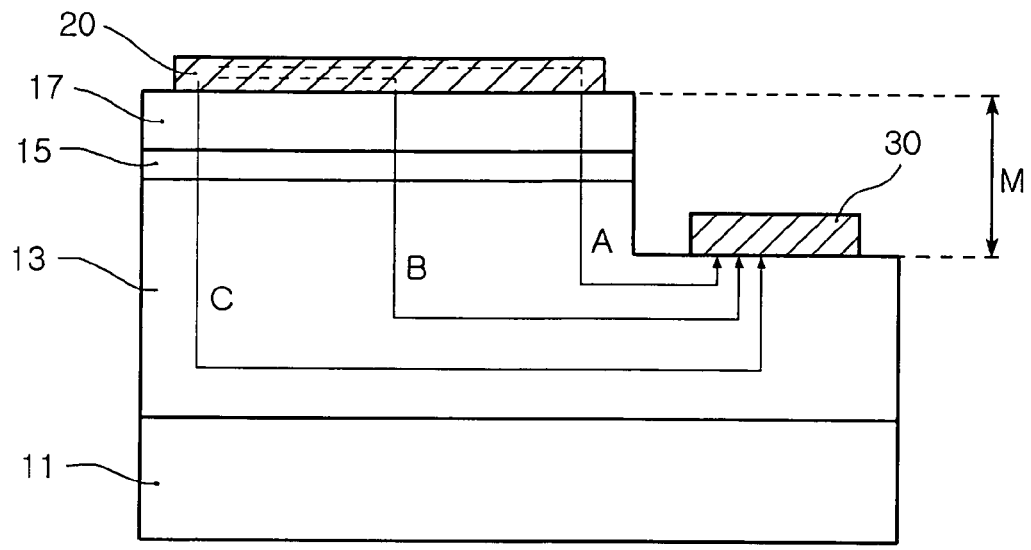
FIG. 1 is a sectional view illustrating a conventional semiconductor light emitting device.

Preferred embodiments of the present invention will now be described in detail with reference to the accompanying drawings. The invention may however be embodied in many different forms and should not be construed as limited to the embodiments set forth herein. Rather, these embodiments are provided so that this disclosure will be thorough and complete, and fully convey the scope of the invention to those skilled in the art. In the drawings, the shapes and dimensions may be exaggerated for clarity and the same reference numerals are used throughout to designate the same or similar components.

The present invention can be applied to the nitride semiconductor light emitting devices having lateral structures, which often entail the problem of current concentration as mentioned above. However, the present invention is not limited thereto but can be applied to other compound semiconductors light emitting devices having lateral structures.

Figure 2:
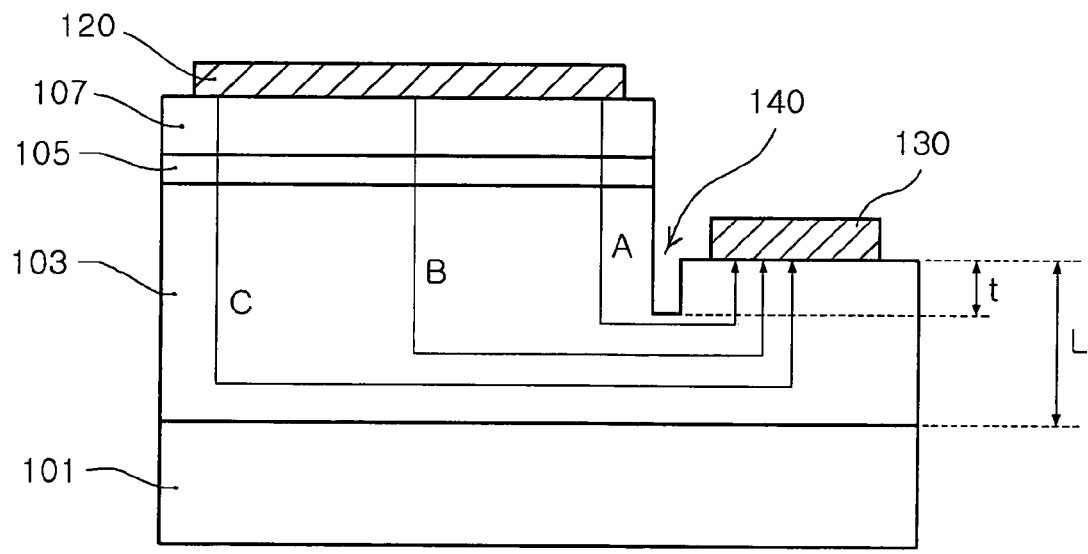
FIG. 2 is a sectional view illustrating a semiconductor light emitting device according to an embodiment of the present invention.

FIG. 2 is a sectional view illustrating a nitride semiconductor light emitting device according to an embodiment of the present invention. Referring to FIG. 2, the semiconductor light emitting device 100 includes an n-type nitride semiconductor layer 103, an active layer 105 and a p-type semiconductor layer 107 sequentially formed on a sapphire substrate 101. A p-electrode 120 is formed on the p-type nitride semiconductor layer 107. The p-electrode 120 may be a transparent electrode or a reflective electrode. For example, in the case where the light exiting surface is located above the p-electrode 120, the p-electrode 120 should be configured into a transparent electrode. In the case where the light exiting surface is located below the substrate 101, the p-electrode 120 should be configured into a reflective electrode. An n-electrode 130 is formed on a portion of an upper surface of the n-type nitride semiconductor layer 103 exposed by mesa-etching.

As shown in FIG. 2, a trench 140 is formed in the n-type semiconductor layer 103. The trench 140 is located between the p-electrode 120 and the n-electrode 130. In addition, the trench 140 is extended downward from an upper surface of the mesa-etched portion of the n-type semiconductor layer into the n-type semiconductor layer 103 at a predetermined depth. The trench 140 should be formed such that it does not completely penetrate through the n-type semiconductor layer 103. Preferably, the trench 140 has a depth t that is ½ or less of the thickness L of the mesa-etched portion of the n-type semiconductor layer, and more preferably, ⅙ to ½ of the thickness L of the mesa-etched portion of the n-type semiconductor layer.

The trench 140 for preventing current concentration can be formed via, for example, a dry etching process such as Inductively Coupled Plasma Reactive Ion Etching (ICP-RIE). That is, a portion of the n-type semiconductor layer is exposed via mesa-etching, and then the trench 140 can be formed in the mesa-etched portion of the n-type semiconductor layer via ICP-RIE as shown in FIG. 2. Besides the dry etching process, the trench 140 can be formed via, for example, a laser process.

By forming the trench 140 in the n-type semiconductor layer 103 as described above, the current path (path A) from an edge portion of the p-electrode 120 adjacent to the n-electrode 130, to the nitride semiconductor layer is lengthened. That is, the trench 140 functions to disconnect a current path (e.g. path A in FIG. 1) that otherwise would have passed through a portion of the nitride semiconductor layer where the current trench is formed, thereby lengthening the entire current paths during the operation of the light emitting device. Resultantly, the difference between the length of path A and that of path B or C is decreased. As the differences between the lengths of current paths A, B and C passing through the nitride semiconductor layer are decreased, the current is not concentrated in some region but is spread over an entire area of the device. Thus, the trench 140 allows enhanced current spreading effect.

Figure 3:
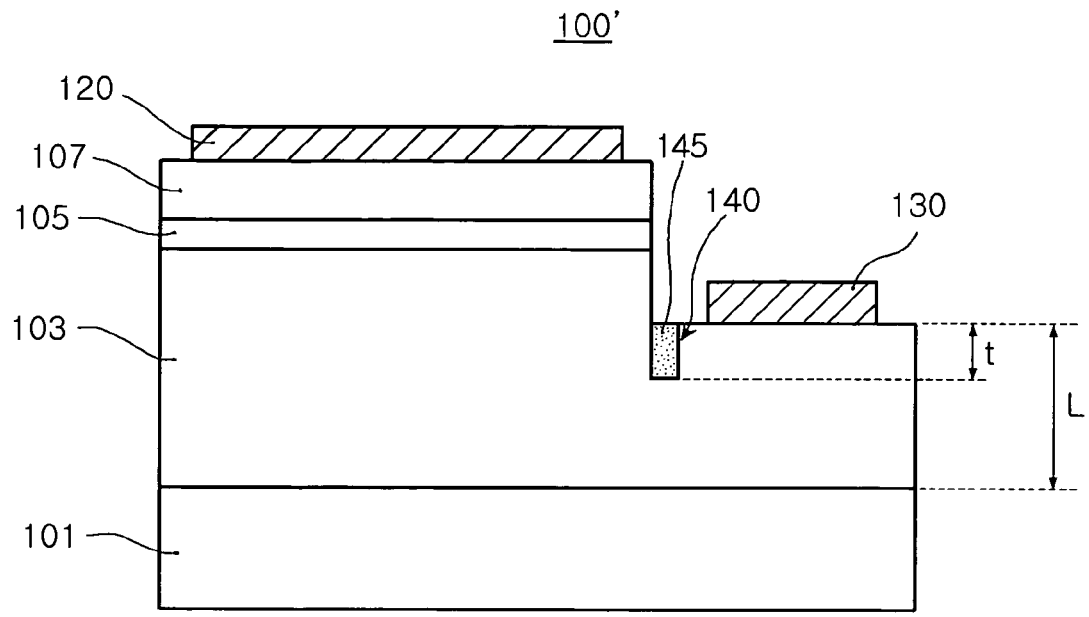
FIG. 3 is a sectional view illustrating a semiconductor light emitting device according to another embodiment of the present invention.

FIG. 3 is a sectional view illustrating a nitride semiconductor light emitting device according to another embodiment of the present invention. The nitride semiconductor light emitting device 100' of FIG. 3 is identical to the previously described light emitting device 100 except that an insulation material 145 is filled in the trench 140 to prevent current concentration. The insulation material 145 can be filled in the trench 140 as described above to prevent unwanted short-circuit or current leakage. For the insulation material 145, for example an insulation resin or oxide film may be filled in the trench 140.

According to the embodiment in FIG. 3, the trench 140 or the insulation material 145 in the trench 140 obstructs the short current path (see path A in FIG. 1) that causes current concentration. Therefore, similar to the previous embodiments, current concentration in the particular current path is suppressed and the current spreading characteristics are improved in this embodiment.

Figure 4:
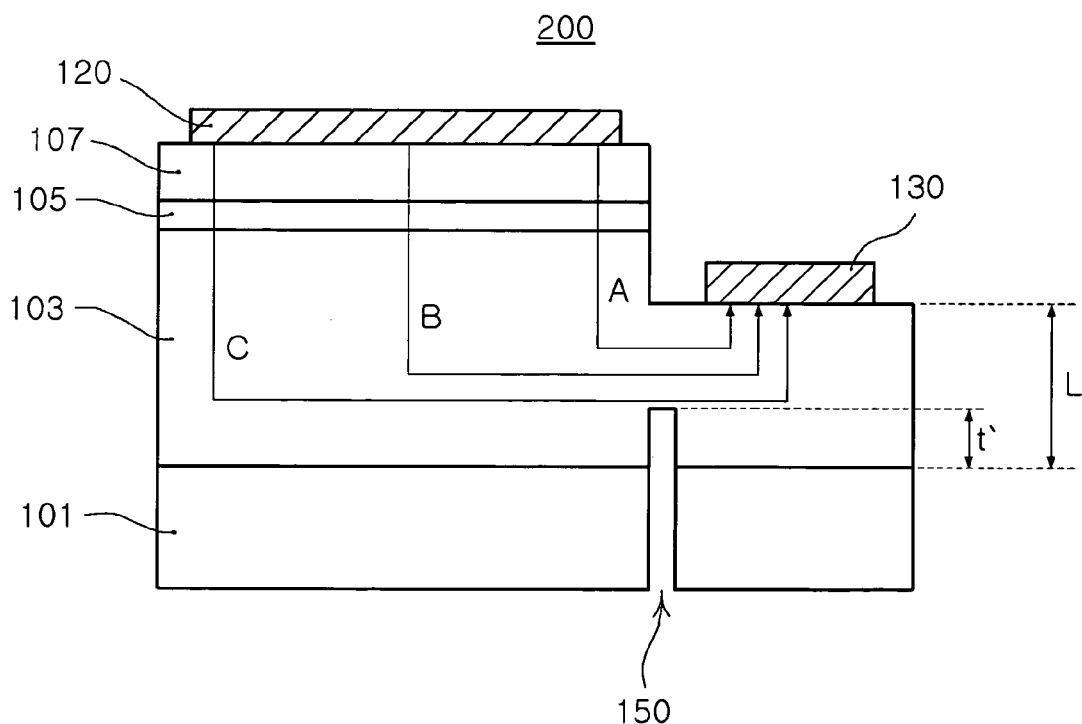
FIG. 4 is a sectional view illustrating a semiconductor light emitting device according to further another embodiment of the present invention.

FIG. 4 illustrates a nitride semiconductor light emitting device according to further another embodiment of the present invention. In the semiconductor light emitting device 200 in FIG. 4, the trench 150 for preventing current concentration is extended upward from a bottom surface of the sapphire substrate 101. In particular, the trench 150 is extended into the mesa-etched portion of the n-type nitride semiconductor layer 103 at a predetermined depth.

As described in the previous embodiments, it should be noted that the trench 150 is formed such that it does not completely penetrate through the n-type nitride semiconductor layer 103. Preferably, the trench 150 is extended into the n-type semiconductor layer 103 at a depth t' that is ½ or less of the thickness L of the n-type semiconductor layer, and more preferably, ⅙ to ½ of the thickness L of the n-type semiconductor layer. In this embodiment, the depth t' of the trench 150 into the n-type semiconductor layer 103 equals to the difference between the total depth of the trench 150 and the thickness of the sapphire substrate 101. Therefore, the difference between the depth of the trench 150 and the thickness of the substrate 101 is preferably ½ or less of the thickness of the mesa-etched portion of the n-type semiconductor layer 103, and more preferably, ⅙ to ½ of the thickness of the mesa-etched portion of the n-type semiconductor layer 103.

Thus, with the trench 150 formed to extend from a bottom surface of the sapphire substrate 101 into the n-type semiconductor layer 103 at a predetermined depth, current paths B and C passing through the nitride semiconductor layer are shortened. Thus, the difference between the length of path A and that of path B or C is decreased. With the smaller differences between the lengths of paths A, B and C, the current is not concentrated in a particular region such as path A but is spread over an entire area of the device during the operation of the device. As a result, the trench 150 allows enhanced current spreading characteristics.

Figure 5:
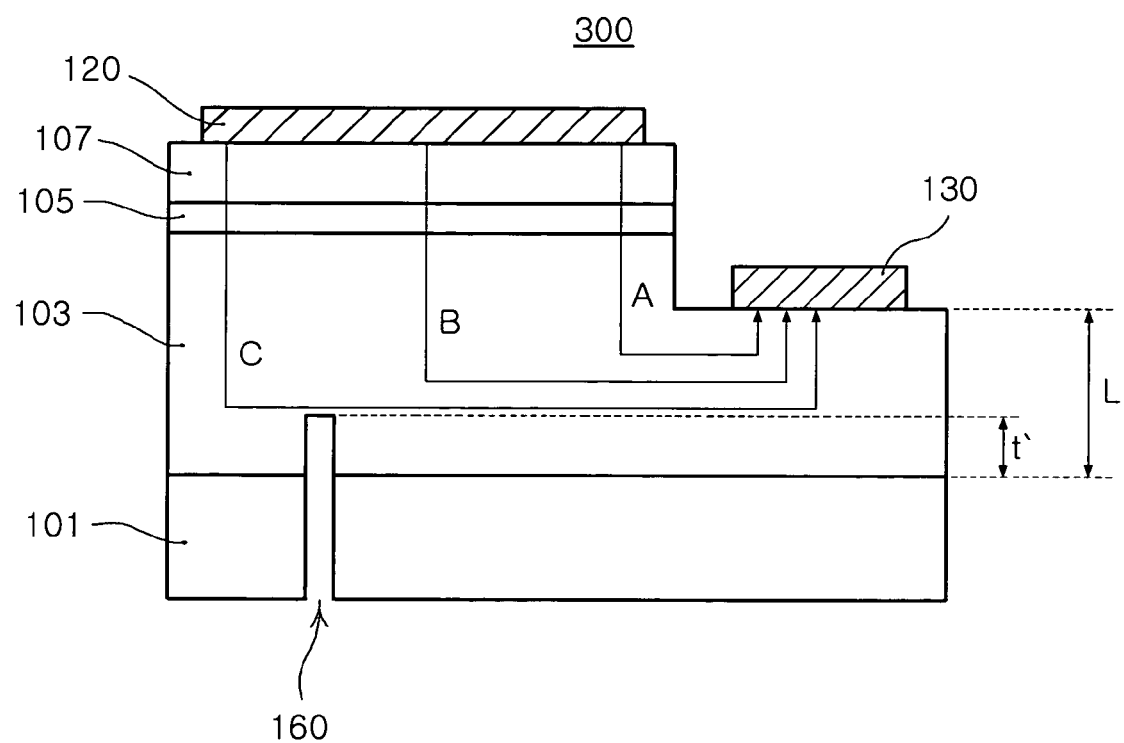
FIG. 5 is a sectional view illustrating a semiconductor light emitting device according to yet another embodiment of the present invention.

FIG. 5 illustrates a nitride semiconductor light emitting device 300 which is a variation from the light emitting device 200 of FIG. 4. As shown in FIG. 5, the trench 160 for preventing current concentration is extended from a bottom surface of the sapphire substrate 101 and can be extended into the portion of the n-type semiconductor layer 103 that is not mesa-etched. Similar to the previous embodiments, the trench 160 does not completely penetrate through the n-type semiconductor layer 103 in this embodiment. The depth of the trench 160 extended into the n-type semiconductor layer 103, i.e., the difference t' between the total depth of the trench 160 and the thickness of the sapphire substrate 101 is preferably ½ or less of the thickness L of the mesa-etched portion of the n-type semiconductor layer 103, and more preferably, ⅙ to ½ of the thickness L of the mesa-etched portion of the n-type semiconductor layer 103.

Similar to the previous embodiments, in this embodiment illustrated in FIG. 5, paths B and C are shortened due to the trench 160, and the differences between paths A, B and C are decreased. With the smaller differences between the lengths of the current paths passing through the nitride semiconductor layer, the current is not concentrated in some region but is spread over an entire area of the device during the operation of the device. As a result, the trench 160 allows enhanced current spreading characteristics. Similar to the previous embodiments, in these embodiments shown in FIGS. 4 and 5, the insulation material such as an insulation resin can be filled in the trench 150, 160 to prevent short-circuit or current leakage.

The above embodiments are exemplified by a nitride semiconductor light emitting device having a sapphire substrate, but the present invention is not limited thereto. The invention may be applied to other types of compound semiconductor light emitting devices, for example, AlGaAs-based or AlGaInP-based semiconductor light emitting devices.

According to the present invention set forth above, a light emitting device includes a trench to decrease the differences between current paths passing through semiconductor layer, thereby preventing current concentration and more uniformly spreading the current. Thus, the light emitting device has increased current paths and decreased overall resistance and operating voltage. Moreover, the device has an enlarged area of electron-hole recombination to thereby achieve enhanced light emission efficiency and luminance due to uniform current flow. Further, due to such current spreading effect, the device has improved electrostatic discharge and heat characteristics, ultimately leading to enhanced reliability thereof.

While the present invention has been shown and described in connection with the preferred embodiments, it will be apparent to those skilled in the art that modifications and variations can be made without departing from the spirit and scope of the invention as defined by the appended claims.

What is claimed is:

1. A semiconductor light emitting device comprising:
an n-type semiconductor layer, an active layer and a p-type semiconductor layer sequentially formed on a substrate;
a p-electrode formed on the p-type semiconductor layer; and
an n-electrode formed on an upper surface of a mesa-etched portion of the n-type semiconductor layer,
wherein the n-type semiconductor layer has a trench formed therein to prevent current concentration, and wherein the trench extends from a bottom surface of the substrate into the n-type semiconductor layer at a predetermined depth.

2. The semiconductor light emitting device according to claim 1, wherein the trench is extended into the n-type semiconductor layer at a depth that is ½ or less of the thickness of the mesa-etched portion of the n-type semiconductor layer.

3. The semiconductor light emitting device according to claim 1, wherein the trench is extended into the n-type semiconductor layer at a depth that is ⅙ to ½ of the thickness of the mesa-etched portion of the n-type semiconductor layer.

4. The semiconductor light emitting device according to claim 1, wherein the trench is filled with an insulating material.

5. The semiconductor light emitting device according to claim 1, wherein the trench is extended upward from a bottom surface of the substrate.

6. The semiconductor light emitting device according to claim 5, wherein the trench is extended to the mesa-etched portion of the n-type semiconductor layer.

7. The semiconductor light emitting device according to claim 5, wherein the trench is extended to the portion of the n-type semiconductor layer that is not mesa-etched.

8. The semiconductor light emitting device according to claim 5, wherein the difference between the depth of the trench and the thickness of the substrate is ½ or less of the thickness of the mesa-etched portion of the n-type semiconductor layer.

9. The semiconductor light emitting device according to claim 5, wherein the difference between the depth of the trench and the thickness of the substrate is ⅙ to ½ of the thickness of the mesa-etched portion of the n-type semiconductor layer.

10. The semiconductor light emitting device according to claim 1, wherein the n-type semiconductor layer, the active layer and the p-type semiconductor layer are made of nitride semiconductor, and the substrate comprises a sapphire substrate.

11. A semiconductor light emitting device comprising:
an n-type semiconductor layer, an active layer and a p-type semiconductor layer sequentially formed on a substrate;
a p-electrode formed on the p-type semiconductor layer; and
an n-electrode formed on an upper surface of a mesa-etched portion of the n-type semiconductor layer,
wherein the n-type semiconductor layer has a trench formed therein to prevent current concentration, and wherein the trench extends from a bottom surface of the substrate into the n-type semiconductor layer at a predetermined depth, and the trench passes through only the substrate and the n-type semiconductor layer.

* * * * *